United States Patent
Mullarkey et al.

(10) Patent No.: US 6,903,991 B2
(45) Date of Patent: *Jun. 7, 2005

(54) CIRCUIT FOR PROGRAMMING ANTIFUSE BITS

(75) Inventors: Patrick J. Mullarkey, Meridian, ID (US); Casey R. Kurth, Eagle, ID (US); Jason Graalum, Boise, ID (US); Daryl L. Habersetzer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/178,605

(22) Filed: Jun. 24, 2002

(65) Prior Publication Data

US 2002/0163827 A1 Nov. 7, 2002

Related U.S. Application Data

(60) Continuation of application No. 10/098,262, filed on Mar. 15, 2002, which is a division of application No. 09/635,965, filed on Aug. 10, 2000, now Pat. No. 6,445,605, which is a continuation of application No. 09/274,932, filed on Mar. 23, 1999, now Pat. No. 6,130,834, which is a continuation of application No. 08/891,669, filed on Jul. 10, 1997, now Pat. No. 6,055,173, which is a division of application No. 08/522,174, filed on Aug. 31, 1995, now Pat. No. 5,689,455.

(51) Int. Cl.$^7$ ................................................ G11C 7/00
(52) U.S. Cl. ................. 365/225.7; 365/200; 326/38; 327/51; 327/525
(58) Field of Search ............................. 365/225.7, 200, 365/96; 326/38; 327/525, 51, 57

(56) References Cited

U.S. PATENT DOCUMENTS

| | | | |
|---|---|---|---|
| 5,293,339 A | 3/1994 | Suzuki | 327/525 |
| 5,371,414 A | 12/1994 | Galbraith | 365/96 |
| 5,418,487 A | 5/1995 | Armstrong | 327/525 |
| 5,424,672 A | 6/1995 | Cowles | 327/525 |
| 5,495,436 A | 2/1996 | Callahan | 365/96 |
| 5,514,980 A * | 5/1996 | Pilling et al. | 326/38 |
| 5,619,469 A | 4/1997 | Joo | 365/225 |
| 5,677,882 A | 10/1997 | Isa | 365/225 |
| 5,677,884 A | 10/1997 | Zagar | 365/200 |
| 5,689,455 A * | 11/1997 | Mullarkey et al. | 365/96 |
| 5,706,238 A | 1/1998 | Cutter et al. | 365/225 |
| 5,731,734 A | 3/1998 | Pathak | 327/525 |
| 5,838,625 A | 11/1998 | Cutter | 365/225 |
| 6,011,742 A | 1/2000 | Zheng | 365/225 |
| 6,055,173 A | 4/2000 | Mullarkey et al. | 365/96 |
| 6,130,834 A | 10/2000 | Mullarkey et al. | 365/96 |
| 6,424,584 B1 | 7/2002 | Seyyedy | 365/225 |
| 6,445,605 B1 | 9/2002 | Mullarkey et al. | 365/96 |
| 6,661,693 B2 | 12/2003 | Mullarkey et al. | 365/96 |

* cited by examiner

Primary Examiner—Son T. Dinh
(74) Attorney, Agent, or Firm—Wong, Cabello, Lutsch, Rutherford & Brucculeri, LLP

(57) ABSTRACT

Circuitry for programming antifuse elements is provided which permits all antifuse elements in a bank to be programmed simultaneously, thereby enhancing the speed at which antifuse elements may be programmed. In one embodiment, a feedback circuit is associated with each antifuse element to stop the flow of current through the antifuse element once it is programmed. In another embodiment, circuitry is provided for generating a separate programming pulse for each antifuse element, which is selected for programming.

7 Claims, 8 Drawing Sheets

CIRCUIT FOR PROGRAMMING ANTIFUSE BITS

This application is a continuation of co-pending prior application Ser. No. 10/098,262 filed on Mar. 15, 2002, entitled "NOVEL ULTRASONIC VIBRATION MODE FOR WIRE BONDING," which was a Rule 53(b) Divisional of prior application Ser. No. 09/635,965 filed on Aug. 10, 2000, now U.S. Pat. No. 6,445,605 (presently allowed but not issued), which was a Rule 53(b) continuation application Ser. No. 09/274,932 filed on Mar. 23, 1999, now U.S. Pat. No. 6,130,834, which was a continuation of application Ser. No. 08/891,669 filed on Jul. 10, 1997, now U.S. Pat. No. 6,055,173, which was a Rule 1.53(b) Divisional of application Ser. No. 08/522,174 filed on Aug. 31, 1995, now U.S. Pat. No. 5,689,455.

BACKGROUND OF THE INVENTION

1. Field of the Invention

The present invention relates generally to integrated circuit memory products, and, more particularly, to circuitry for programming antifuse bits in such products.

2. Description of the Prior Art

Contemporary memory products, e.g. DRAMs, require a high degree of redundancy in order to improve manufacturing yields. Present redundancy techniques in such memory products include providing extra memory array columns and/or extra memory array rows which can be used to replace defective columns and/or rows.

One application in which antifuses have been used is as nonvolatile programmable memory elements to store logic states which would be used in DRAMs for row and column redundancy implementation. An antifuse is, by definition, a device which functions as an open circuit until programmed to be a permanent short circuit. Antifuses for redundancy implementation are usually constructed in the same manner as the memory cell capacitors in the DRAM array.

In contemporary memory products, banks of antifuse elements are typically provided, and one such bank is illustrated in FIG. 1. Each such bank includes a plurality, n, of antifuse elements $AF_0, AF_1, \ldots AF_n$, the top plates of which are joined in a common connection to the programming voltage CGND. The bottom plate of each antifuse element $AF_i$, is connected to the drain of a protection transistor $PT_i$. The source of each protection transistor $PT_i$ is connected to the drain of selection transistor $ST_i$, and the sources of the selection transistors $ST_i$, are joined in a common connection to ground. The function of each protection transistor $PT_i$ is to protect the selection transistor from breakdown between its N+ region and gate when the high programming voltage is applied to the drain. The gate of each selection transistor $ST_i$ is respectively connected to the outputs of NOR gate $NG_i$, the inputs of which are the signal PGM* and the selection signals $A_i^*$. The selection signals $A_i^*$ are the complements of the signals $A_i$ and may correspond to the address of a row in the memory product which is to be repaired.

A particular antifuse element, e.g. $AF_i$, is selected for programming when $A_i^*$ and PGM* are both zero volts. In this condition the output of $NG_i$ is approximately +5 volts which turns on the selection transistor $ST_i$ to which it is connected. When this selection occurs, a path exists between the bottom plate of the selected antifuse device and ground. Hence, the selected antifuse device $AF_i$ sees a large voltage CGND, e.g. 9 to 12 volts, between its top and bottom plates, which is a sufficient voltage to program the antifuse element. When two or more antifuse elements are to be programmed, the same voltage CGND is applied in parallel to the antifuse elements to be programmed.

Several shortcomings exist in utilizing the programming technique for antifuse elements such as shown in FIG. 1. First, programming of the antifuse elements is slow using the technique shown in FIG. 1, because each antifuse element has to be programmed one at a time. This is due to the fact that each antifuse element needs a minimum amount of current and voltage to program correctly. If two antifuse elements are enabled for programming at the same time, one most assuredly will breakdown (i.e., become programmed) before the other. The programmed antifuse thus creates a path to ground for the current from CGND, which may impact the voltage and current needed for programming of the other antifuse element. In other words, the voltage across the slower-to-program antifuse element may be reduced to a level that no programming of this element is realized. Additionally, the problem may become acute when one attempts to program three or four antifuse elements in such a bank at once. Accordingly, the prior art solution to these problems was to program the antifuse elements in a bank one at a time, which results in the speed of redundancy repair of a memory product being reduced.

Once programming of antifuse elements is completed, it is important that the user verify that those elements which are to be programmed are in fact programmed. Also, it is important that the user verify that antifuse elements which are not to be programmed are functioning properly. In the latter regard, unprogrammed antifuse devices may leak and appear to be programmed devices. No such verification circuitry has heretofore been available.

SUMMARY OF THE INVENTION

In accordance with the present invention, improved circuitry is provided for programming antifuse devices. With the present invention, the speed of programming antifuse elements is enhanced, because all of the antifuse elements in a bank may be programmed simultaneously.

In one embodiment of the present invention, the same programming voltage CGND is still applied in parallel across all antifuse elements to be programmed by enabling this respective selection transistors. However, in this embodiment, a feedback circuit is associated with each antifuse element to stop the flow of current from CGND through the antifuse element once it is programmed. With this feedback circuitry, a programmed antifuse element can no longer affect the voltage across and current through antifuse elements which are slower to program.

In another embodiment of the present invention, circuitry is provided which generates a separate programming voltage pulse for each antifuse element in a bank which is selected for programming. In this embodiment, the same voltage source is not applied in parallel across all of the antifuse elements that are to be programmed, and the programming voltage across and current through an antifuse element that is to be programmed is unaffected by other antifuse elements which may have programmed more quickly.

In accordance with the present invention, method and apparatus are provided to verify that an antifuse element is programmed properly. The method and apparatus also verify if a nonprogrammed antifuse element is functioning properly.

DESCRIPTION OF THE PREFERRED EMBODIMENT

It will be appreciated that the present invention may take many forms and embodiments. Some embodiments of the invention are described so as to give an understanding of the invention. It is not intended that the limited embodiments described herein should affect the scope of the present invention.

Figure 2:
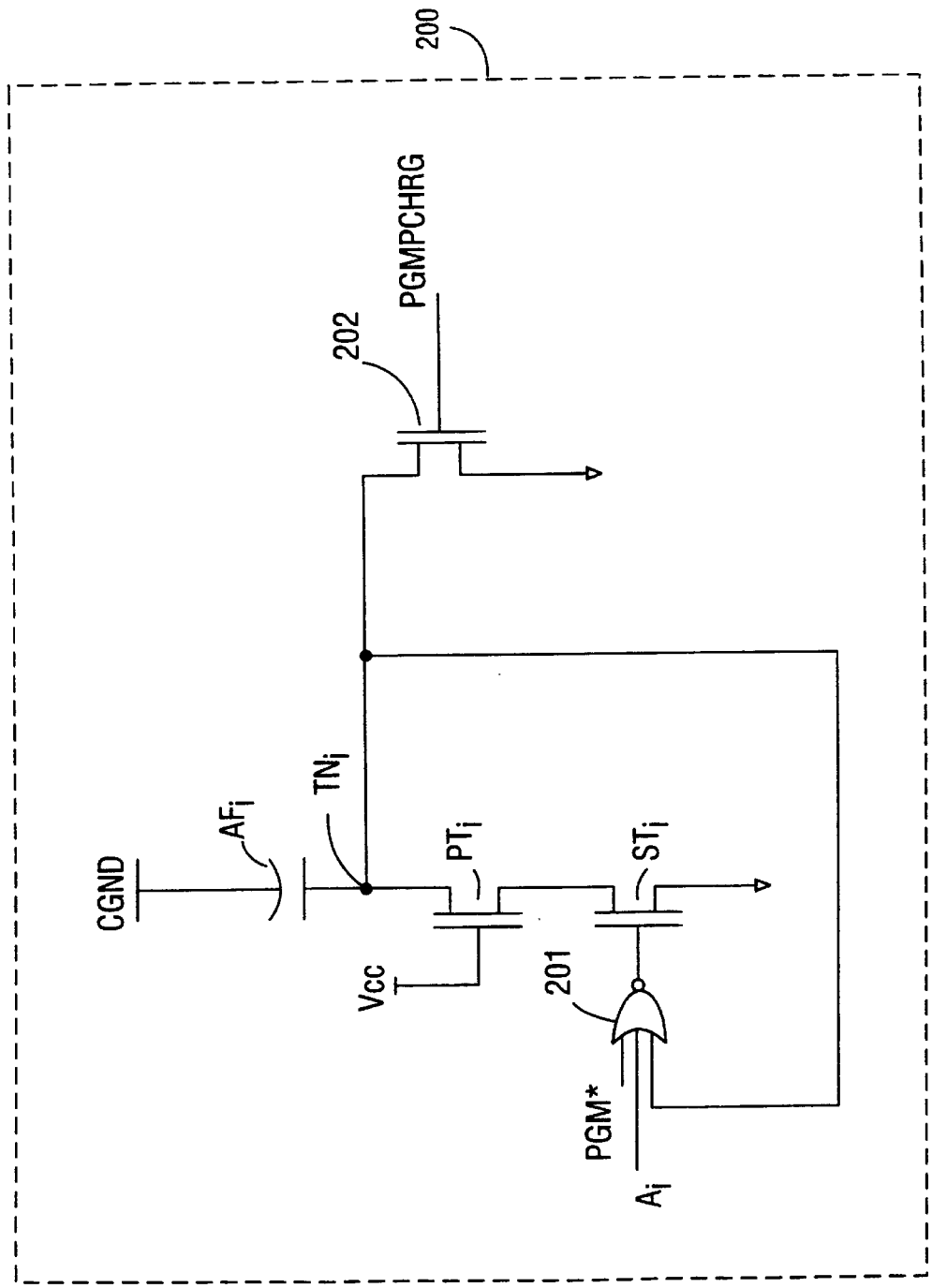
FIG. 2 is a schematic diagram which illustrates one embodiment of circuitry in accordance with the present invention for programming antifuse elements.

With reference to FIG. 2, an embodiment of the present invention is illustrated. In this embodiment the same programming voltage CGND is applied in parallel across all antifuse elements in a bank which are to be programmed in integrated circuit 200. Each bank of elements contains a plurality, n, of antifuse elements, and each of the n antifuse elements in each bank has associated with it circuitry as illustrated in FIG. 2.

Figure 1:
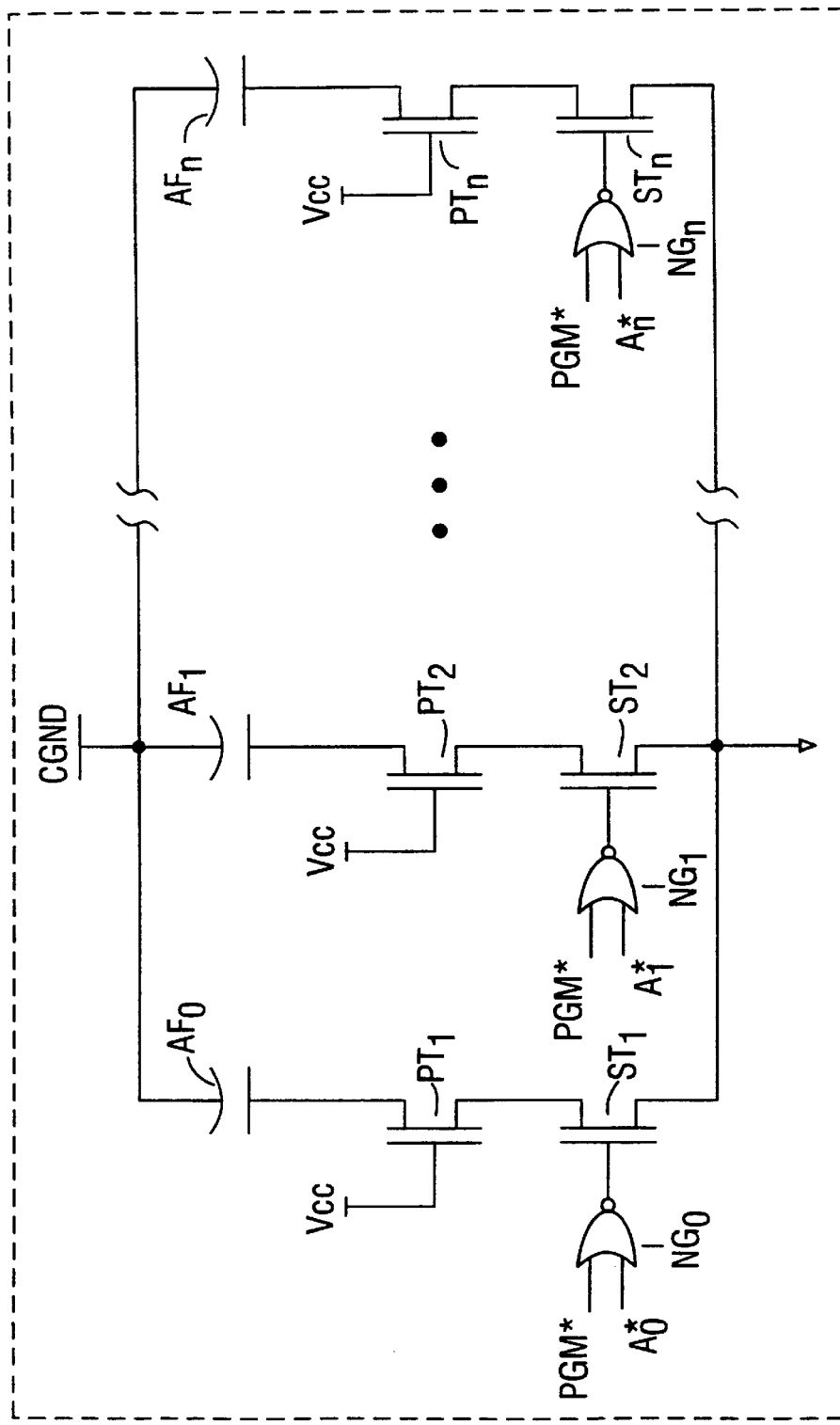
FIG. 1 is a schematic diagram which illustrates a prior art technique for programming antifuse elements.

In FIG. 2, a protection transistor $PT_i$ is provided, and the function of this transistor is identical to the function of transistor $PT_i$ in FIG. 1. Also, in FIG. 2 the gate of the selection transistor $ST_i$ for antifuse element $AF_i$ is connected to the output of three-input NOR gate 201. One input to NOR gate 201 is PGM* which is the complement of the signal PGM, which is a logic 1, e.g. +5 volts, when programming of antifuse elements is to occur. Another input to NOR gate 201 is connected to $A_i^*$, which is the complement of $A_i$, for i=1, . . . n. The signals $A_i$, i=1 . . . n, may, for example, be provided on the address inputs to the memory on the falling edge of CAS and additionally may comprise the n least significant bits of the address of the row of the memory to be repaired. When any $A_i$ is a logic 1, e.g. +5 volts, antifuse element $AF_i$ is to be programmed. The third input to NOR gate 201 is connected to node $TN_i$. Also connected to node $TN_i$ is the drain of transistor 202.

In operation, each node $TN_i$ for i=0, 1 . . . n is precharged to zero volts just prior to the beginning of a programming operation when the signal PGMPCHRG enables transistor 202 to connect node $TN_i$ to ground. When programming is to occur, the output of NOR gate 201 enables selection transistor $ST_i$ for each antifuse element to be programmed. The enablement of transistor $ST_i$ causes the voltage CGND to appear across antifuse element $AF_i$, and this voltage is sufficient to cause programming of antifuse element $AF_i$.

When programming of antifuse element $AF_i$ occurs, current flows through antifuse element $AF_i$, and transistors $PT_i$ and $ST_i$. The voltage developed across the serial combination of transistors $PT_i$ and $ST_i$ from this current causes the voltage at node $TN_i$ to rise to a positive level which is sufficient to be detected as a logic 1. This positive voltage at node $TN_i$ is feedback to the third input of NOR gate 201. At this time, the output of NOR gate 201 falls zero volts, which disables transistor $ST_i$, stopping the flow of current through programmed antifuse element $AF_i$. Thus, through the use of the feedback circuit shown in FIG. 2, an antifuse element $AF_i$ stops conducting current once it is programmed, and the full programming voltage and current are available for other antifuse elements in the bank which are slower to program.

Figure 3:
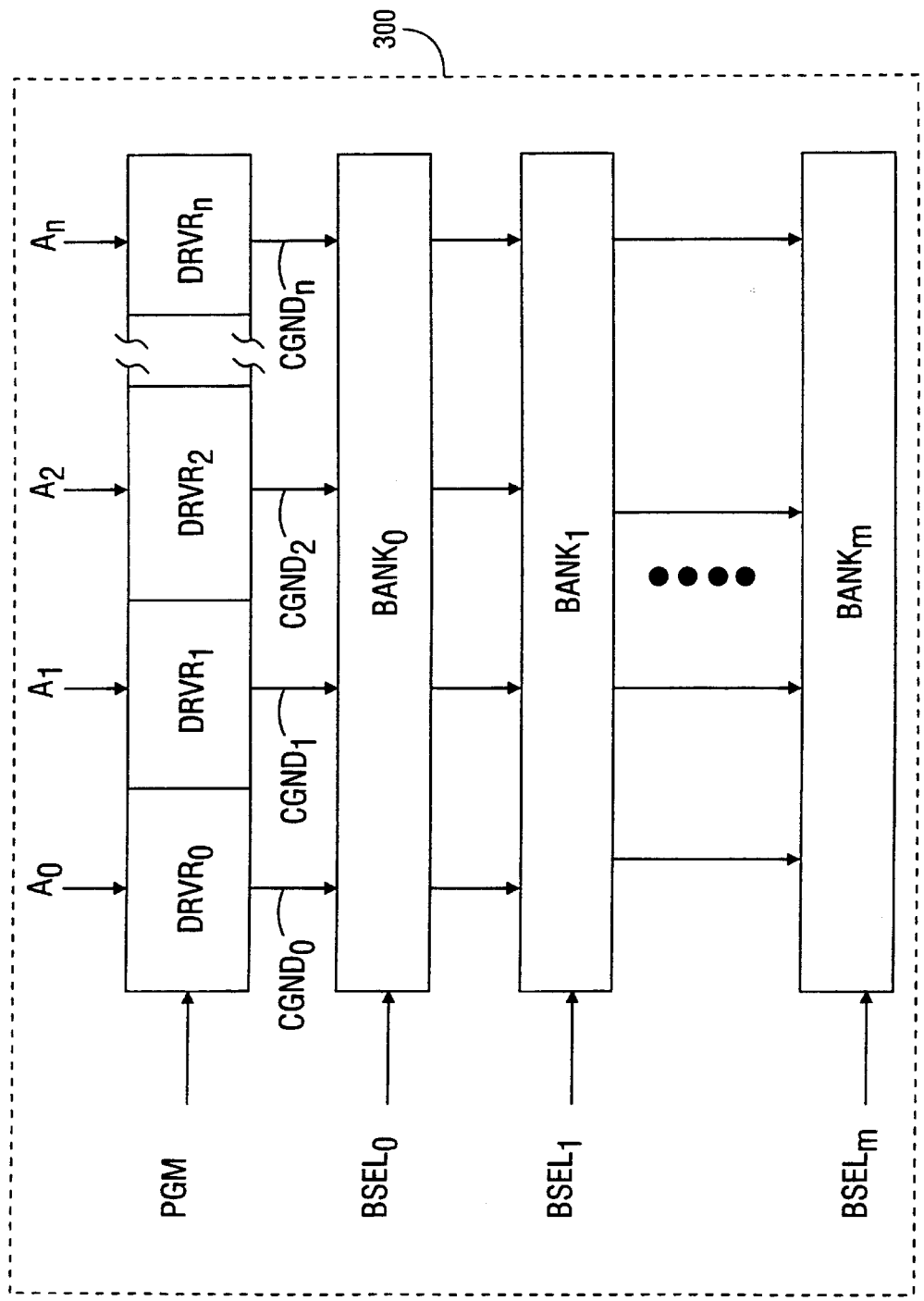
FIG. 3 is a schematic diagram in block diagram form of another embodiment of circuitry in accordance with the present invention for programming antifuse elements.

Referring now to FIG. 3, a portion of another embodiment of the present invention is illustrated. Integrated circuit memory 300 includes a plurality, m, of banks of antifuse elements, designated $BANK_0$, $BANK_i$, . . . $BANK_m$ in FIG. 3. Each bank contains a plurality, n, of antifuse elements. A separate driver circuit $DRVR_i$ (i=0 to n) is provided to supply separate programming pulses to each antifuse elements in each bank, as described in more detail below.

Figure 4:
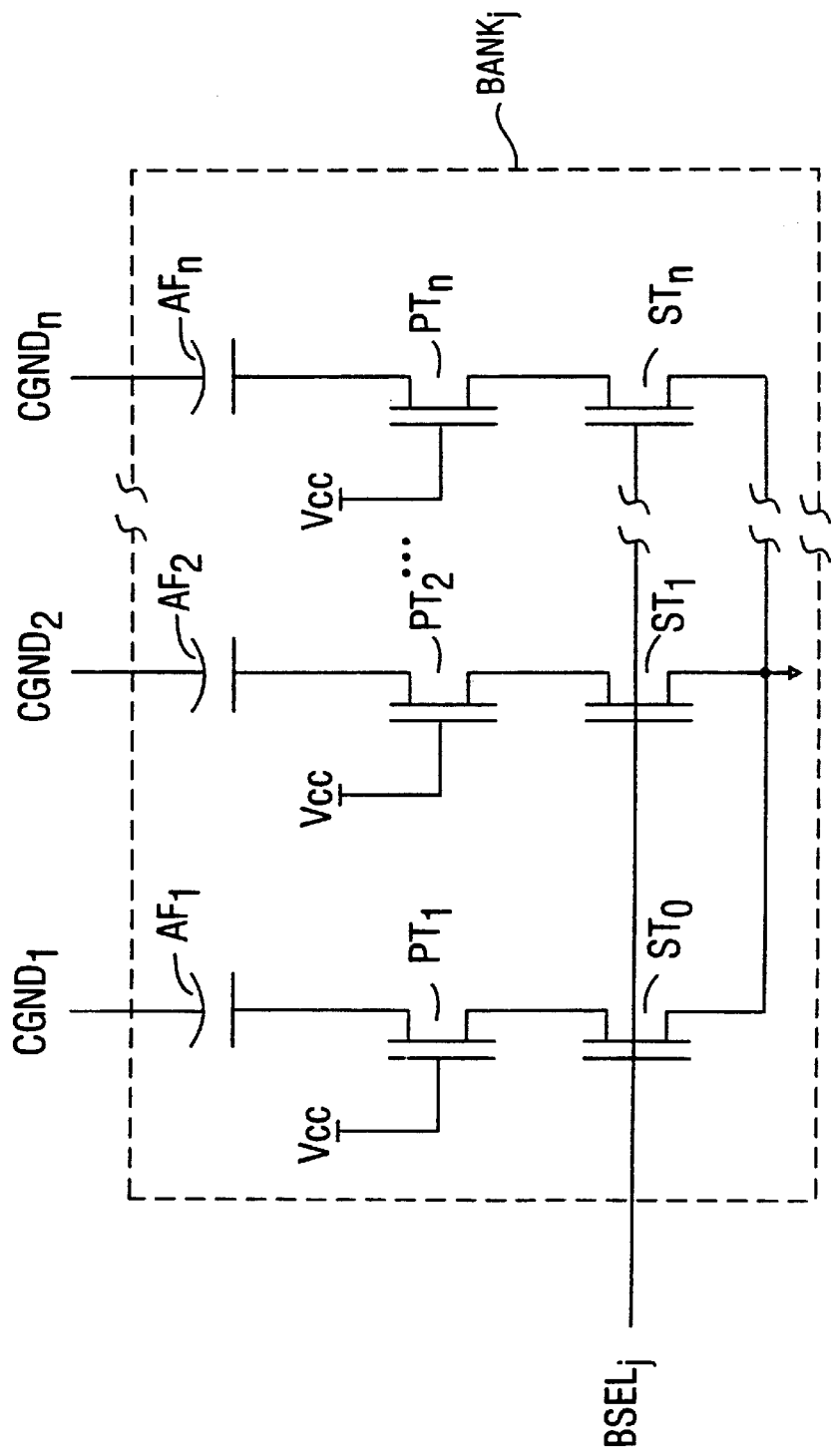
FIG. 4 is a schematic diagram depicting elements in a bank of antifuse elements shown in FIG. 3.

Referring to FIG. 4, the circuit components included in each bank of antifuse elements of FIG. 3 is shown. Each antifuse element $AF_i$ in a bank is connected through a protection transistor $PT_i$ to the drain of a selection transistors $ST_i$, where i=0, 1, . . . n. Protection transistor $PT_i$ in FIG. 4 performs the same function as protection transistor $PT_i$ in FIGS. 1 and 2.

Figure 3A:
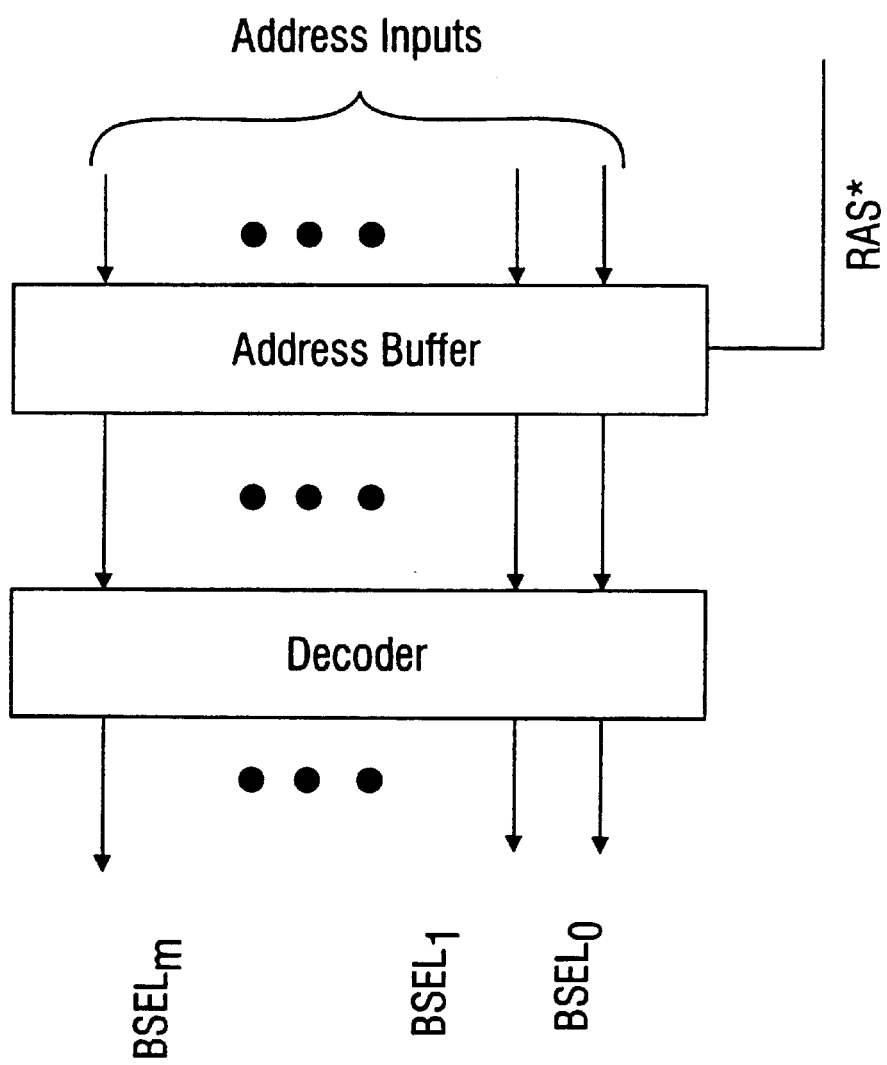
FIG. 3A is a schematic diagram in block diagram form which depicts circuitry for decoding inputs to select one of the banks of antifuse elements shown in FIG. 3.

Only one bank of antifuse elements in FIG. 3 is selected for programming at any given time. A bank select signal $BSEL_j$, j=1 . . . m is connected to all of the gates of the bank select transistors $ST_i$ in a given bank as shown in FIG. 4. The bank select signal $BSEL_j$ may be generated, for example, by decoding the most significant bits of the row address to be repaired. These most significant bits are available to the memory product on the falling edge of the RAS* signal as shown in FIG. 3A. The circuitry to make this bank selection is decoder 301 as shown in FIG. 3A.

Figure 5:
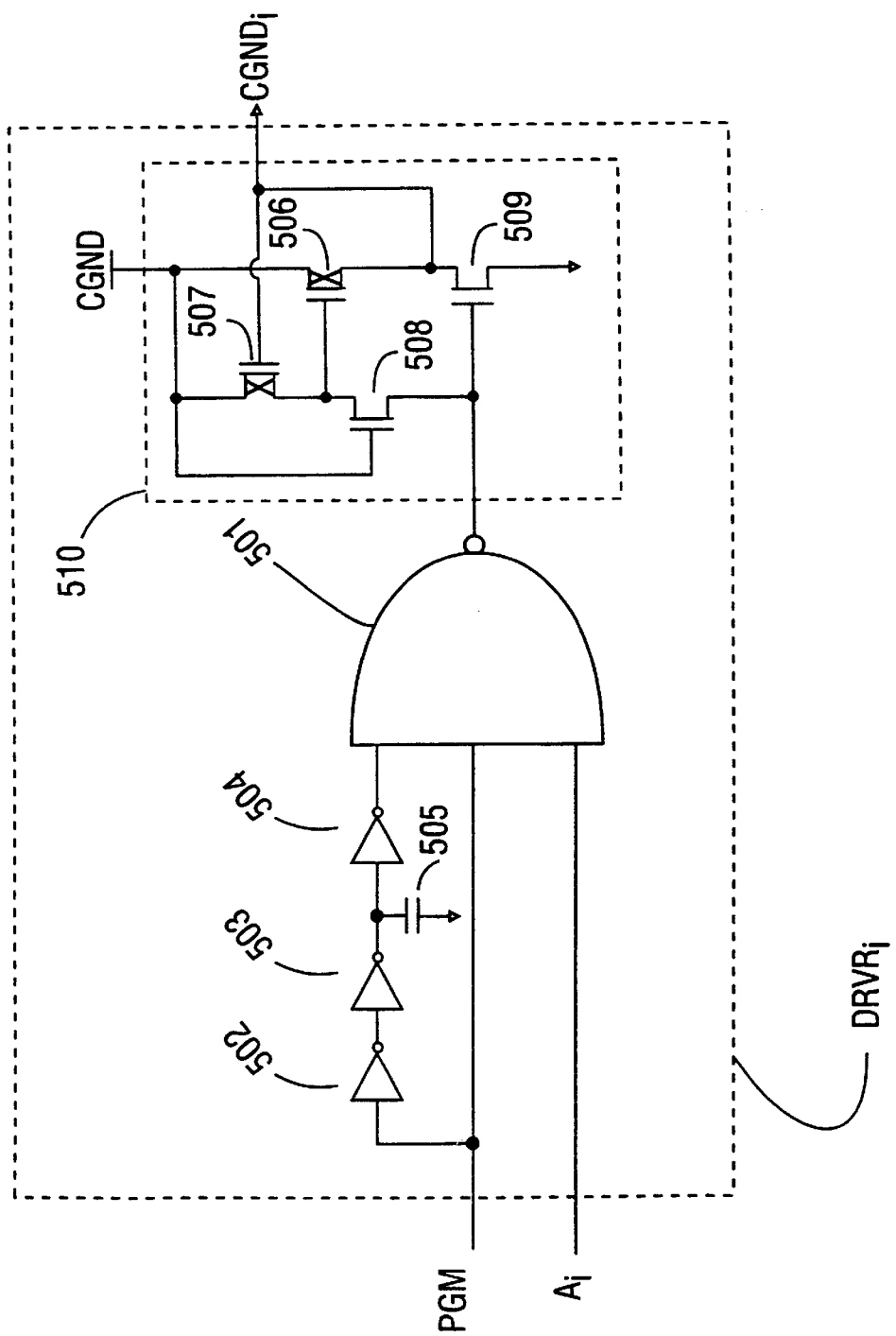
FIG. 5 is a schematic diagram of one embodiment of each driver circuit of FIG. 3.

In accordance with the present invention, each driver $DRVR_i$, i=0, . . . n, of FIG. 3 provides a separate programming pulse $CGND_i$ to an antifuse element in the bank that is selected for programming. Referring to FIG. 5, one embodiment of each driver circuit $DRVR_i$ for i=0, . . . n of FIG. 3 is shown. Each such driver circuit comprises NAND gate 501, inverters 502–04, capacitor 505, P-channel transistors 506 and 507 and N-channel transistors 508 and 509. As illustrated, one input to NAND gate 501 is connected to the selection signal $A_i$ for the antifuse $AF_i$ with which it is associated. If an antifuse element $AF_i$ is to be programmed, the $A_i$ signal associated with it is a logic 1. As noted above, the $A_i$ signals may correspond to n least most significant bits of the address of the row in a memory to be repaired.

Another input to NAND gate 501 is connected to the signal PGM, which is normally 0 volts and which is brought to a logic one level, e.g. +5 volts, when antifuse elements are to be programmed. The logical value of the signal at the output of inverter 504 is the complement of the signal PGM.

The circuitry of FIG. 5 operates as follows to generate a programming pulse $CGND_i$ for each antifuse element $AF_i$, i=0, . . . n, to be programmed. When the signal PGM is brought to a logic 1 value, e.g. +5volts, to begin programming of antifuses, the output of inverter 504 is a logic 1 based on the logic zero state of PGM before programming began. The output of NAND gate 501 becomes a logic 0 (i.e., 0 volts) for each AFi which is to be programmed. The output of NAND gate 501 is an input to level translator 510, which includes p-channel transistors 506 and 507 and N-channel transistors 508 and 509 all connected as shown. As shown in FIG. 5, the programming voltage CGND is also an input to level translator 510.

The output of NAND gate 501 is a logic zero when programming of its associated antifuse is to occur. At this time transistor 509 is disabled and p-channel transistor 506 is enabled since the voltage on its gate is zero volts. At this time, a high voltage programming signal $CGND_i$ is generated for each antifuse $AF_i$ to be programmed.

The duration of each programming signal $CGND_i$ is determined by the width of the logic zero pulse at the output of its associated NAND gate 501, which in turn is determined by the propagation delay of the combination of inverters 502–04 and capacitor 505. When the duration of the logic zero pulse at the output of NAND gate 501 is completed, (i.e., when the output of NAND gate 501 rises from a logic 0 to a logic 1), transistor 509 is enabled which pulls each programming pulse $CGND_i$ to zero volts. At this time, p-channel transistor 507 is enabled, and the full programming voltage CGND is applied to the gate of p-channel transistor 506, and this programming voltage ensures that transistor 506 is disabled at the end of the programming pulse $CGND_i$.

If any of the antifuses $AF_i$ in the selected bank is programmed before the others in the selected bank, the programming of that antifuse element cannot adversely affect the programming of the other elements. Since the programming pulses $CGND_i$ that are provided by drivers $DRVR_i$ are independent of one another, all antifuse elements that are to be programmed will be provided a sufficient voltage to effect programming, even though some of the antifuse elements in the selected bank are slower to program than others.

The circuitry of FIG. 5 is acceptable for use in programming antifuse elements that require only a fairly short duration pulse for programming. As the duration of the programming signal $CGND_i$ for programming to occur increases, the number of delay elements such as inverters 502–04 and capacitor 505 also increases. Hence, for those antifuse elements requiring a longer duration pulse for programming, it has been found that the circuitry of FIG. 6 is preferable to that shown in FIG. 5.

Figure 6:
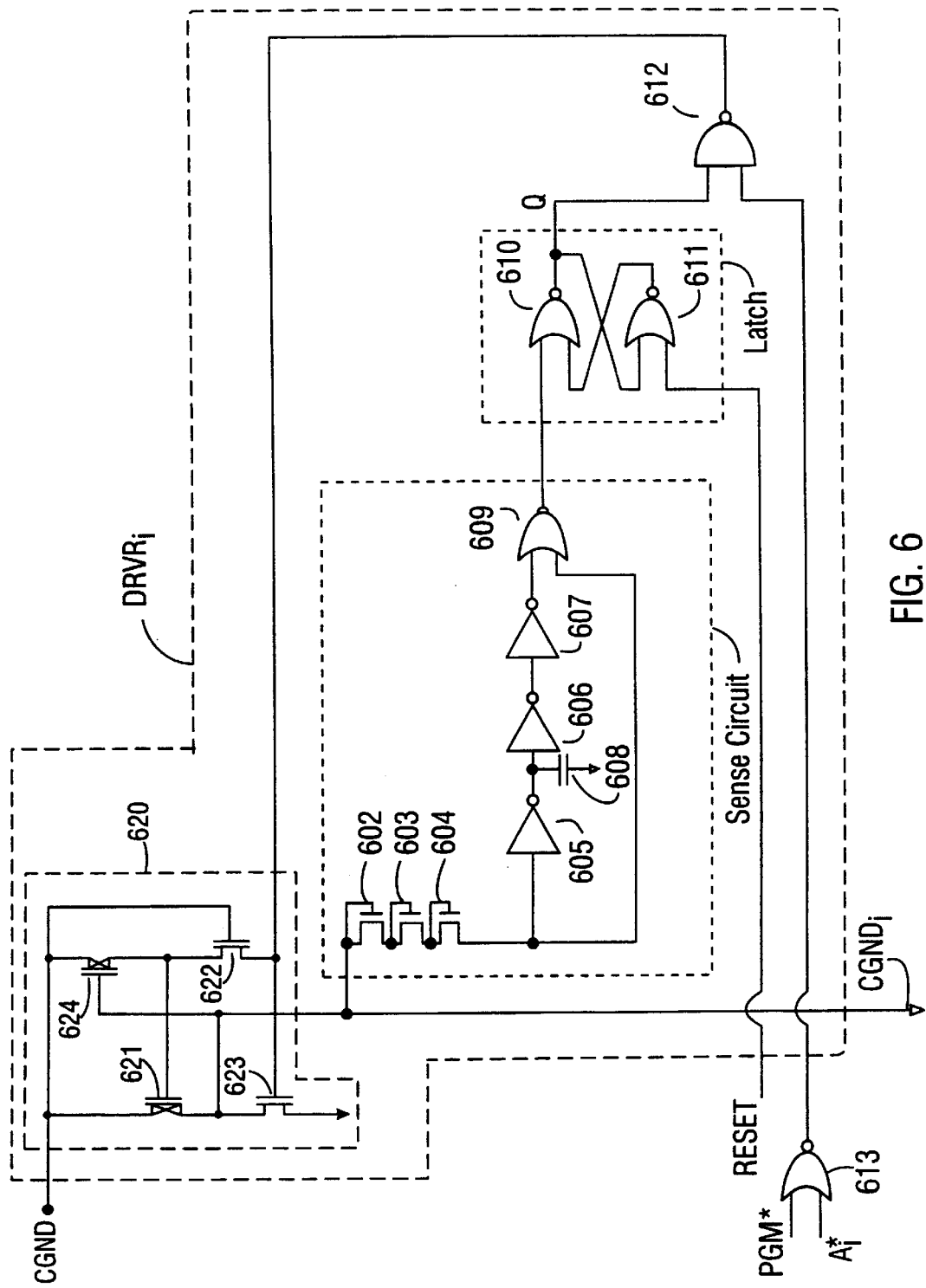
FIG. 6 is a schematic diagram of a second embodiment of each driver circuit of FIG. 3.

Referring to FIG. 6, a preferred embodiment of the driver circuits DRVR, of FIG. 3 is shown. This embodiment comprises transistors 602–604 each of which is connected as a diode, inverters 605–07, capacitor 608, NOR gate 609, NOR gates 610 and 611, NAND gate 612 and NOR gate 613, all connected as shown in FIG. 6. This embodiment also includes level translator 620, which is identical to level translator 510 in FIG. 5. Transistors 602–04, inverters 605–07, capacitor 608 and NOR gate 609 form a sense circuit for sensing when an antifuse has been programmed. NOR gates 610 and 611 are cross-coupled to form a latch having an output Q.

Prior to beginning an operation to program antifuses, the RESET signal is generated, which forces the output Q of NOR gate 610 to a logic 1. For each antifuse element $AF_i$ to be programmed, $A_i^*$ will be a logic zero. When programming is to begin, PGM* is a logic zero, which results in the output of NAND 612 being a logic zero. Transistor 623 is disabled, and p-channel transistor 621 is enabled, since the voltage on its gate is zero volts. A high voltage programming signal $CGND_i$ is thus generated. The magnitude of $CGND_i$ is about 9 to 12 volts, which is sufficient to effect programming of antifuse $AF_i$.

Before antifuse $AF_i$ is programmed, the voltage drop across transistors 602–604 is such that the voltage at the output of transistor 604 is slightly higher than the minimum voltage that can be recognized as a logic 1. For example, when $CGND_i$ is the high programming voltage, the voltage on the output of transistor 604 may be about +3 volts.

When the selected antifuse element $AF_i$ does program, the magnitude of $CGND_i$ drops, which results in the voltage at the output of transistor 604 decreasing to a level which is lower than the maximum voltage level that can be recognized as a logic zero. The falling edge of the signal which is at the output of transistor 604. is detected by the sense circuit comprising inverters 605–607, capacitor 608 and NOR gate 609, with the output of NOR gate 609 pulsing to a logic 1 upon detection of that falling edge. This logic 1 pulse forces the output Q of the latch composed of NOR gates 610 and 611 to a logic zero and the output of NAND 612 to a logic 1. At this time, transistor 623 is enabled, and the programming signal $CGND_i$ is pulled to zero volts. P-channel transistor 624 is thus enabled, and the full programming voltage CGND appears on the gate of p-channel transistor 621, thereby assuring that p-channel transistor 621 is disabled once programming of the antifuse $AF_i$ has been effected.

In this embodiment, the programming pulses $CGND_i$ that are provided by drivers $DRVR_i$ are also independent of one another, and all antifuse devices that are to be programmed will be provided a sufficient voltage to effect programming, even though some of the antifuse elements in the selected bank are slower to program than others.

Figure 7:
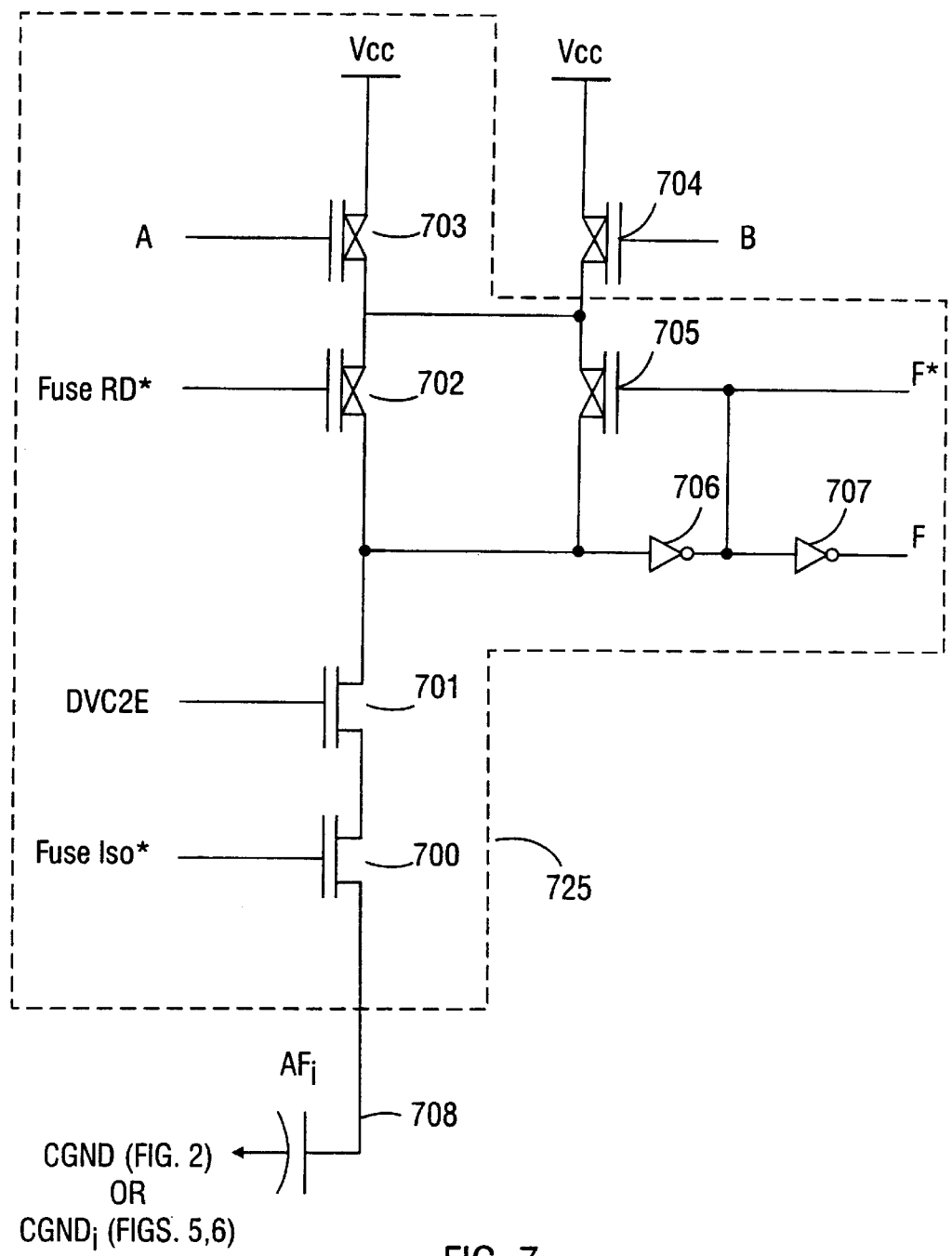
FIG. 7 is a schematic diagram of circuitry that may be used to ascertain that antifuse elements are functioning properly, once the programming process is completed.

The circuitry 725 of FIG. 7 has been used in prior memories of Micron. In such memories, the antifuses would be read and constantly compared to the address values supplied to the memory. If a match occurred, a match signal was triggered which caused the real row or column at that address to be replaced with a redundant row or column. However, this operation was not apparent to the user, so a test mode was designed so that when the memory was in this test mode and a match occurred, a signal would be triggered to activate circuitry attached to the output of the integrated circuit memory. The test mode circuitry in the prior memories was developed to check if a particular address had already been repaired prior to programming an antifuse, and was not developed to ensure that an antifuse was programmed correctly.

In accordance with the present invention, verification circuitry is provided for verifying that: (a) an unprogrammed antifuse does not have a resistive short, i.e., is not leaky; and (2) a programmed antifuse is programmed properly. This useful result is realized in a preferred embodiment combining P-channel transistor 704 with circuitry 725 as illustrated in FIG. 7. This verification circuitry is provided for and connected to each antifuse $AF_i$.

With reference still to FIG. 7, the source of transistor 700, which is designated 708, is connected to one side of antifuse element $AF_i$, as shown. The other side of the antifuse element $AF_i$ is connected to the signal CGND, if the programming circuitry of FIG. 2 is used, or to $CGND_i$, if the programming circuitry as illustrated in FIGS. 3–6 is utilized for programming. During the verification process, the signals CGND and $CGND_i$ are at zero volts.

During the programming operation, transistor 700 was disabled. However, once the programming operation is completed transistor 700 is enabled by the signal in FUSEISO*. In series with transistor 700 is transistor 701 whose gate is driven by the signal DVC2E. The magnitude of the signal DVC2E is approximately 1.5 to 2 volts which enables transistor 701 to act as a current limiter. Thus, during the verification process, one side of antifuse $AF_i$ is connected to the node constituting the input to inverter 706. Each transistor 700, 701 has a width/length of 10/2.

The verification circuitry of FIGS. 7 also includes P-channel transistors 702, 703, 704, and 705, all connected as shown in FIG. 7. P-Channel transistor 702 is enabled during the verification process by the signal FUSERD*. The width/length ratio of transistor 703 is preferably 5/25 and the width/length ratio of transistor 704 is preferably 5/50.

In operation, the verification circuitry of FIG. 7 operates as follows to detect an unprogrammed antifuse that has a resistive short, i.e., to detect an antifuse which is leaky. In this mode of operation, transistor 704 is enabled into a conduction state using the signal B. At this time transistor 703 is turned off. The voltage on the node which is the input to inverter 706 will attempt to charge via transistors 704 and 702. If the unprogrammed antifuse $AF_i$ that is being tested is functioning properly, the voltage on the node which is the input to inverter 706 will charge to $V_{cc}$. The output of inverter 706 under this condition is zero volts, which turns on transistor 705 thereby improving the charge path to the input to inverter 706. In this situation, the signal F is a logic 1, while the signal F* is a logic 0. However, if an unprogrammed antifuse element is leaky, it will have a resistance of less than 86 Kohms, and the voltage on the node at the input to inverter 706 will not be charged to +5 volts. This results in the signal F being a logic 0, while the signal F* is a logic 1. This state of the signals F and F* thus indicates that an unprogrammed antifuse is leaky.

To verify that a programmed antifuse element is correctly programmed, both transistors 703 and 704 are enabled by signals A and B to attempt to charge the voltage at the input to inverter 706. The charge presented to the input to inverter 706 from enabling both transistors 703 and 704 is greater than the charge at the input to inverter 706 from just enabling transistor 704.

If the antifuse element $AF_i$ is properly programmed, its resistance will be less than 27 Kohms, which is sufficiently low to prevent the voltage on the node at the input to inverter 706 from being charged to +5 volts. In this situation, the signal F is a logic 0, while the signal F* is a logic 1. On the other hand, if the antifuse element $AF_i$ did not program properly, it will have a resistance greater than 27 Kohms, and the voltage on the node at the input to inverter 706 will charge to a level that is detected as a logic 1. Hence, in this situation, the signal F will be a logic 1 and the signal F* will be a logic 0. This state of the signals F and F* thus indicate that an antifuse which was to be programmed did not program properly.

What is claimed is:

1. An antifuse programming circuit for an integrated circuit memory device comprising:

an antifuse element having a top plate coupled to a programming voltage;

a selection transistor associated with said antifuse element, the enablement of said selection transistor resulting in a path being provided for the programming of said antifuse element associated with said selection transistor; and a feedback circuit associated with said antifuse element to stop the flow of current through said antifuse element once said antifuse element is programmed.

2. The antifuse programming circuit in accordance with claim 1, further comprising:

a NOR gate having a first input, a second input, a third input, and one output;

wherein the output of said NOR gate is connected to a control input of said selection transistor; and wherein said NOR gate is responsive to a logical high signal applied to said first and second inputs to enable said selection transistor to which it is connected for the programming of the antifuse element associated with said selection transistor.

3. The antifuse programming circuit in accordance with claim 2, further comprising:

a protection transistor connected to said antifuse element at a first node and connected to said selection transistor at a second node;

wherein said feedback circuit comprises a connection between said first node and said third input of said NOR gate.

4. The antifuse programming circuit in accordance with claim 3, wherein said feedback node is precharged to zero volts just prior to programming of said antifuse element.

5. The antifuse programming circuit in accordance with claim 3, wherein said first node is charged to a positive voltage sufficient to be detected as a logic 1 in response to programming of said antifuse element; and said positive voltage being applied to said third input of said NOR gate by said feedback circuit.

6. The antifuse programming circuit in accordance with claim 2, wherein said selection transistor is enabled by said output of said NOR gate.

7. The antifuse programming circuit in accordance with claim 1, wherein enablement of said selection transistor causes said programming voltage to appear across said antifuse element.

\* \* \* \* \*